United States Patent
Concepcion et al.

(10) Patent No.: US 10,871,507 B2
(45) Date of Patent: Dec. 22, 2020

(54) SEMICONDUCTOR DEVICE HANDLER WITH CHUCK CLAMP INTERLOCK

(71) Applicant: Texas Instruments Incorporated, Dallas, TX (US)

(72) Inventors: Sonny Baskiñas Concepcion, Benguet (PH); Giovanni Hufana Nieva, Baguio (PH); Daniel Mendoza Ramirez, Jr., Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 223 days.

(21) Appl. No.: 16/227,743

(22) Filed: Dec. 20, 2018

(65) Prior Publication Data

US 2020/0200796 A1    Jun. 25, 2020

(51) Int. Cl.
| | |
|---|---|
| *G01R 1/04* | (2006.01) |
| *G01R 31/26* | (2020.01) |
| *H01L 21/673* | (2006.01) |
| *H01L 21/687* | (2006.01) |
| *H01L 21/67* | (2006.01) |

(52) U.S. Cl.
CPC ....... *G01R 1/0425* (2013.01); *G01R 31/2601* (2013.01); *H01L 21/67103* (2013.01); *H01L 21/67383* (2013.01); *H01L 21/68728* (2013.01); *H01L 21/68764* (2013.01)

(58) Field of Classification Search
USPC .................................................. 324/756.01
See application file for complete search history.

(56) References Cited

U.S. PATENT DOCUMENTS

| | | | | |
|---|---|---|---|---|
| 4,577,847 A | * | 3/1986 | Schedwin ............ | B23Q 11/005 269/309 |
| 4,738,439 A | * | 4/1988 | Satake ................... | B23Q 16/04 269/309 |
| 4,981,441 A | * | 1/1991 | Ignasiak .............. | G01R 1/0425 439/269.1 |
| 5,516,087 A | * | 5/1996 | Schmid .................... | B23Q 1/28 269/226 |
| 5,550,481 A | * | 8/1996 | Holmes .............. | G01R 1/06705 324/754.13 |
| 5,831,160 A | * | 11/1998 | Steketee .................. | G01R 1/04 73/431 |

(Continued)

OTHER PUBLICATIONS

Summit SHP, "Specification", Delta Design, downloaded Nov. 9, 2018, 2 pgs.

*Primary Examiner* — Christopher P McAndrew
(74) *Attorney, Agent, or Firm* — Rose Alyssa Keagy; Charles A. Brill; Frank D. Cimino

(57) ABSTRACT

An apparatus includes a clip mounted to a base that pivots about a first pivot axis between a first position and a second position. An abutment surface of the clip is spaced from a path of a carrier structure when the clip is in the first position. The abutment surface engages the carrier structure to secure the carrier structure and a device to the apparatus when the clip is in the second clip position. A cam includes a first surface that pivots the clip to the first clip position when the cam is in the first cam position. The cam includes a second surface that extends into an opening of the base when the cam is in a first position to allow a stop plate pin to engage the cam to rotate the cam from the first position to a second position when a stop plate is installed.

20 Claims, 11 Drawing Sheets

(56) References Cited

U.S. PATENT DOCUMENTS

| | | | |
|---|---|---|---|
| 6,094,057 A * | 7/2000 | Hiruta | G01R 1/0483 |
| | | | 324/756.01 |
| 6,368,137 B1 * | 4/2002 | Orwoll | G01R 1/0483 |
| | | | 439/331 |
| 6,556,032 B2 * | 4/2003 | Uher | G01R 1/0491 |
| | | | 324/750.05 |
| 6,604,738 B2 * | 8/2003 | Haruna | B23Q 11/005 |
| | | | 269/309 |
| 6,831,296 B1 * | 12/2004 | Lee | G01R 31/2886 |
| | | | 257/48 |
| 9,638,748 B2 | 5/2017 | Ramirez, Jr. et al. | |
| 2006/0071656 A1 * | 4/2006 | Joung | G01R 1/0408 |
| | | | 324/757.01 |
| 2007/0075702 A1 * | 4/2007 | Kim | G01R 31/2893 |
| | | | 324/756.01 |
| 2012/0007625 A1 * | 1/2012 | Kim | H01R 12/87 |
| | | | 324/756.01 |
| 2012/0119772 A1 * | 5/2012 | Hirako | G01R 31/68 |
| | | | 324/756.01 |
| 2016/0133503 A1 * | 5/2016 | Miyazaki | H01L 21/68728 |
| | | | 279/110 |
| 2016/0141201 A1 * | 5/2016 | Toyomura | H01L 21/68728 |
| | | | 269/55 |
| 2019/0178007 A1 * | 6/2019 | Palmieri | E05B 63/0004 |
| 2020/0217120 A1 * | 7/2020 | Kozlovic | E05F 5/027 |

* cited by examiner

SEMICONDUCTOR DEVICE HANDLER WITH CHUCK CLAMP INTERLOCK

BACKGROUND

Thermal control pick and place handlers are used in automated semiconductor device testing during manufacturing. For example, burn in testing applies power to the device under test in combination with controlled heat dissipation. The handler includes a chuck that picks up the semiconductor device installed in a carrier structure, moves the device to a test bed, and contacts the device leads with test contacts, such as a bed of nails. The chuck includes a thermal interface that contacts a top side of the device under test for thermal management including heat dissipation, power balancing and junction temperature control during device testing. The chuck also includes a removable stop plate to engage an upper side of the device under test or an associated support structure, such as a lid. However, if a tested device is secured in the chuck when the stop plate is not installed, interior downward force from engagement with the thermal interface and concurrent perimeter upward force from the carrier structure can lead to convex warping or bending of the device under test causing the device package to crack. Manual replacement of stop plate is prone to mishandling or operator error, resulting in package damage during testing.

SUMMARY

Described examples include a chuck apparatus with a clip mounted to a base. The clip is pivotal about a first pivot axis between a first clip position and a second clip position. The clip includes an abutment surface that is spaced apart from a path of a step feature of a carrier structure when the clip is in the first clip position. The abutment surface is positioned to engage the carrier step feature to secure the carrier structure and an installed device under test (DUT) to the chuck apparatus when the clip is in the second clip position. The apparatus includes a cam mounted to the base. The cam is pivotal about a second pivot axis between a first cam position and a second cam position. The cam includes a first surface that engages the clip to pivot the clip to the first clip position when the cam is in the first cam position. The cam includes a second surface that extends into an opening of the base when the cam is in the first cam position. A first spring is connected between the base and the cam to bias the cam toward the first cam position. A second spring is connected between the base and the clip to bias the clip toward the second clip position. In one example, the apparatus includes a stop plate with a pin that extends outward from the stop plate to engage the second surface of the cam in the base opening to rotate the cam from the first cam position to the second cam position when the stop plate is installed in the chuck apparatus. Described examples automatically inhibit the ability for the chuck to pick up the carrier and DUT when no stop plate is installed.

An example system includes the chuck apparatus, as well as a position control system configured to control the chuck apparatus position, a contactor with conductive probes to connect to a DUT, and an electronic test circuit connected to the contactor to test the DUT.

An example method includes installing a stop plate in a chuck apparatus, including translating a pin of the stop plate into an opening of a base of the chuck apparatus to rotate a cam from a first cam position to a second cam position to allow a spring to rotate a clip from a first clip position to a second clip position. The method also includes translating the chuck apparatus in a first direction toward a carrier structure to engage a tapered surface of the clip with a step feature of the carrier structure to pivot the clip from the second clip position toward the first clip position. The method also includes continuing translation of the chuck apparatus in the first direction to pivot the clip outward against a bias of the spring until the step feature of the carrier structure clears an abutment surface of the clip. The method also includes pivoting the clip back to the second clip position using the spring after the carrier structure clears the abutment surface of the clip to engage the step feature with the abutment surface to engage a thermal interface and the stop plate with a device under test (DUT) installed in the carrier structure.

DETAILED DESCRIPTION

Figure 1:
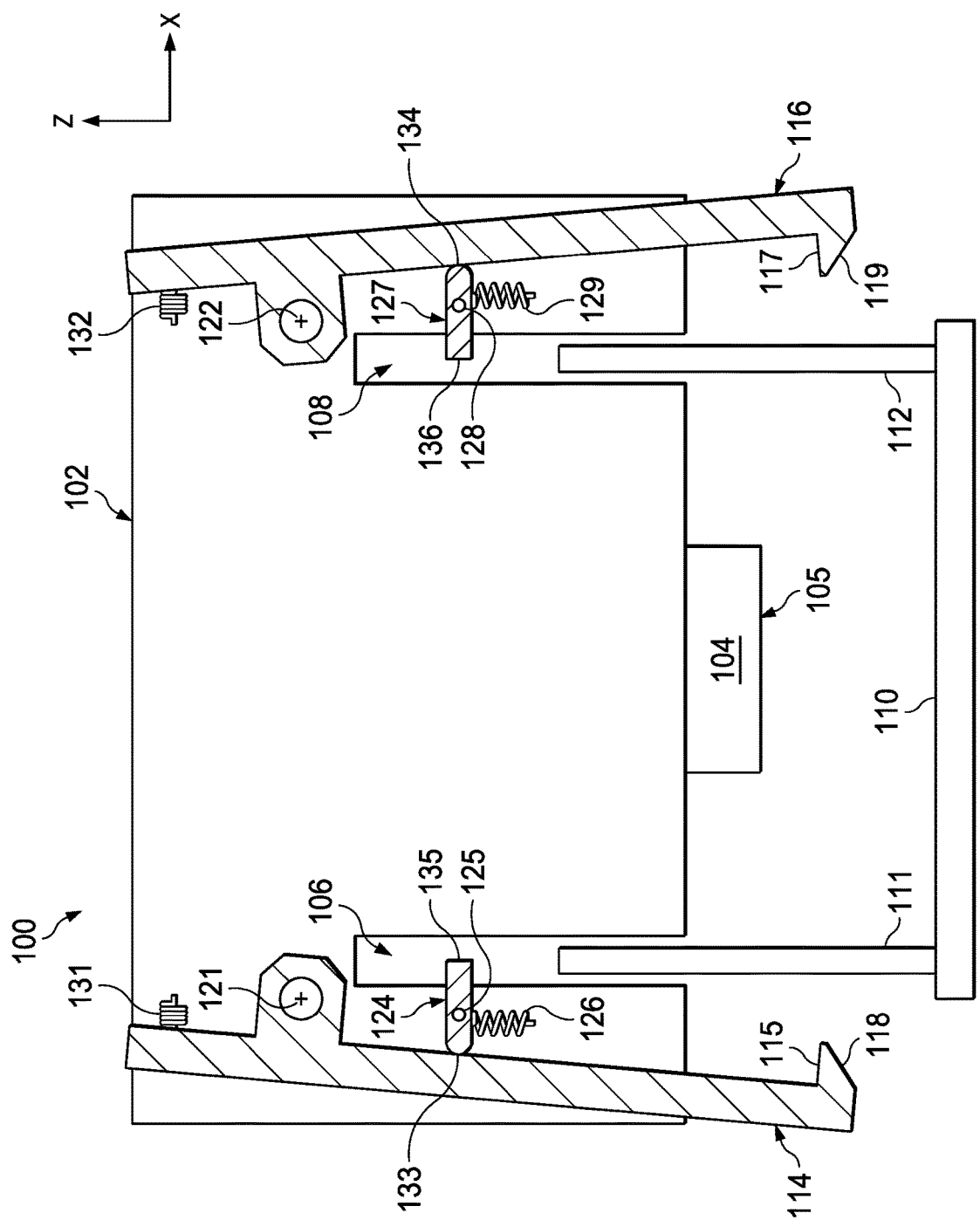
FIG. 1 is a partial sectional side elevation view of a chuck apparatus with normally open clamp interlock clips in a first or open position.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
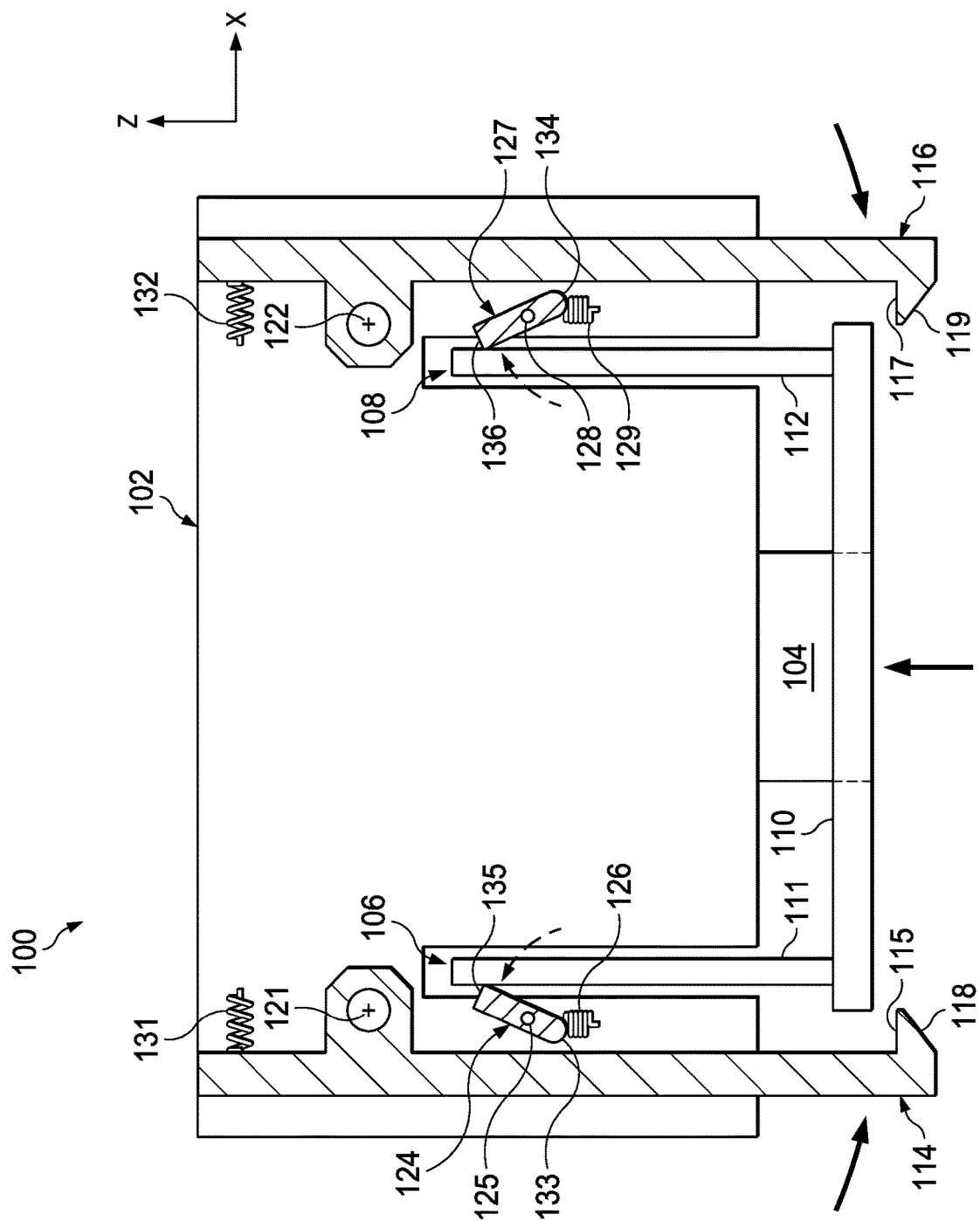
FIG. 2 is a partial sectional side elevation view of the chuck apparatus of FIG. 1 with the clips in a second or closed position.

FIGS. 1 and 2 show an example a chuck apparatus 100. The chuck apparatus 100 includes a base 102 with a thermal interface 104 mounted to a bottom side of the base 102. The base 102 includes first and second openings or channels 106 and 108, respectively, which extend upward into the base 102 from the lower side. The openings 106 and 108 are laterally outwardly spaced from the mounting position of the thermal interface 104 in the illustrated example. The chuck apparatus 100 also includes a stop plate 110 with a first pin 111 that extends outward from the stop plate 110 in the direction of the first opening 106 of the base 102 (e.g., upward from the top side of the stop plate, along the positive Z direction in FIG. 1). The stop plate 110 also includes a second pin 112 that extends upward from the stop plate 110 in the direction of the second opening 108 of the base 102.

The chuck apparatus 100 also has normally open clamp interlock features, including a first pivotally mounted clip 114 with an inwardly extending abutment surface 115 near the lower end of the clip 114. The chuck apparatus 100 also includes a second pivotally mounted clip 116 with an abutment surface 117. The first clip 114 has a tapered surface 118 and the second clip 116 has a tapered surface 119. The first clip 114 is pivotally mounted to the base 102 and is pivotal (i.e., able to pivot) about a first pivot axis 121 of the first clip 114 between a first clip position of the first clip 114 and a second clip position of the first clip 114. The second clip 116 is pivotally mounted to the base 102 and is pivotal about a first pivot axis 122 of the second clip 116 between a first clip position of the second clip 116 and a second clip position of the second clip 116. The abutment surfaces 115 and 117 and the tapered surfaces 118 and 119 of the respective clips 114 and 116 face inward.

A first cam 124 is mounted to the base 102. The first cam 124 is pivotal about a second pivot axis 125 of the first cam 124 between a first cam position of FIG. 1 and a second cam position of FIG. 2. A first spring 126 of the first cam 124 is connected between the base 102 and the first cam 124. The first spring 126 of the first cam 124 biases the cam 124 toward the first cam position of the first cam 124. A second cam 127 is mounted to the base 102 and is pivotal about a second pivot axis 128 of the second cam 127 between a first cam position and a second cam position. A first spring 129 of the second cam 127 is connected between the base 102 and the second cam 127, and the first spring 129 of the second cam 127 biases the second cam 127 toward the first cam position of the second cam 127. The upper ends of the clips 114 and 116 are biased by second springs 131 and 132, respectively. The second spring 131 of the first clip 114 is connected between the base 102 and the first clip 114 to bias the clip 114 toward the second clip position of FIG. 2. The second spring 132 of the second clip 116 is connected between the base 102 and the second clip 116 to bias the second clip 116 toward the second clip position of FIG. 2.

The first cam 124 includes a first surface 133 that engages the first clip 114 to pivot the first clip 114 to the first clip position when the first cam 124 is in the first cam position. The second cam 127 has a first surface 134 that engages the second clip 116 to pivot the second clip 116 to the first clip position when the second cam 127 is in the first cam position. The first cam 124 also includes a second surface 135. As shown in FIG. 1, the second surface 135 extends into the first opening 106 of the base 102 when the first cam 124 is in the first cam position. The second cam 127 includes a second surface 136 that extends into the second opening 108 when the second cam 124 is in the first cam position as shown in FIG. 1. In operation in this example, the translation of the pins 111 and 112 into the respective openings 106 and 108 engages and rotates the cams 124 and 127 from the first cam positions to the second cam positions shown in FIG. 2. FIG. 1 shows the chuck apparatus 100 with the normally open clamp interlock clips 114 and 116 in the first clip positions, in this example, with the lower ends of the clips 114 and 116 pivoted outward. FIG. 2 shows the chuck apparatus 100 with the clips 114 and 116 pivoted inward in the second clip positions. In the illustrated example, the bottom side of the stop plate 110 is flush with the bottom side 105 of the thermal interface 104 in the second clip position of FIG. 2. In one example, the stop plate 110 includes two parallel engagement surfaces that are spaced from one another in the direction into the page in FIG. 2, and which extend laterally along the X direction in FIG. 2 to engage portions of an installed DUT (e.g., FIG. 8 below). In this example, the thermal interface 104 fits between the laterally extending engagement surfaces of the stop plate 110, such that the bottom side 105 of the thermal interface 104 is substantially flush with the bottom side of the stop plate engagement surfaces as shown in FIG. 2.

Figure 3:
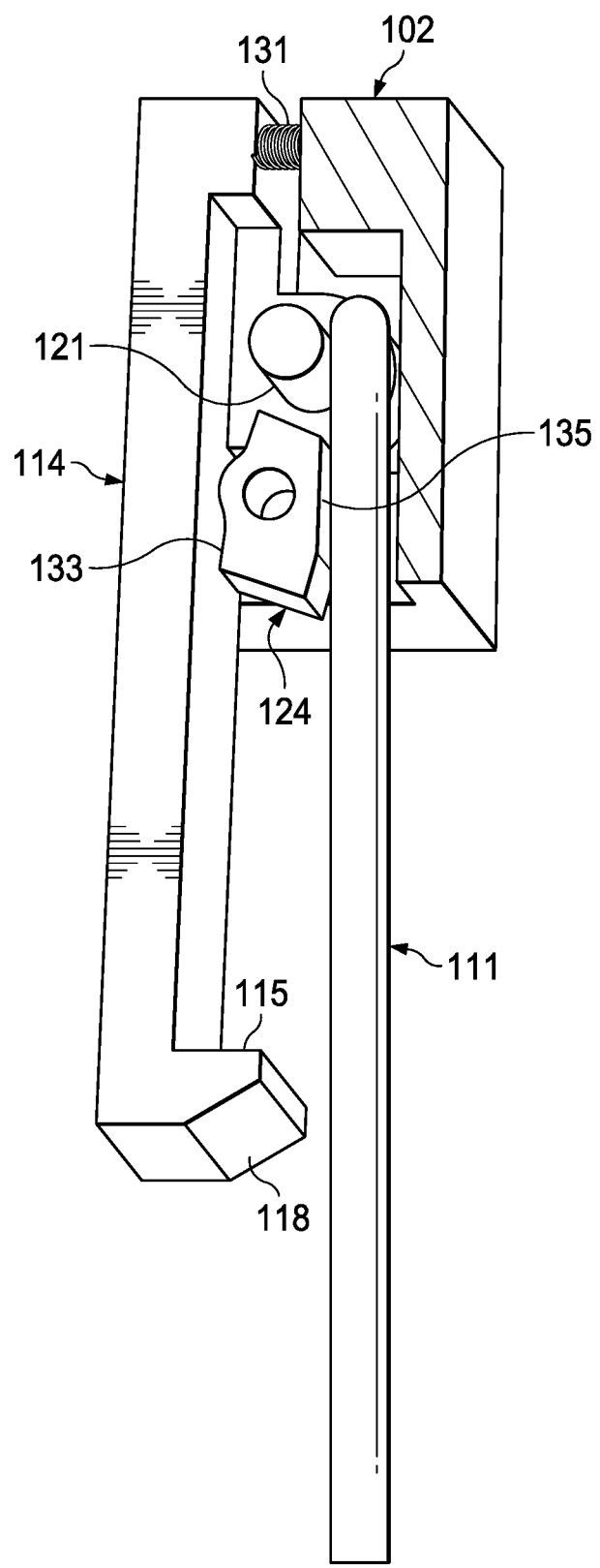
FIG. 3 is a partial front perspective view of a portion of an example clamp interlock of FIG. 1 with a compression spring that biases a clip toward the second or closed position.
Figure 4:
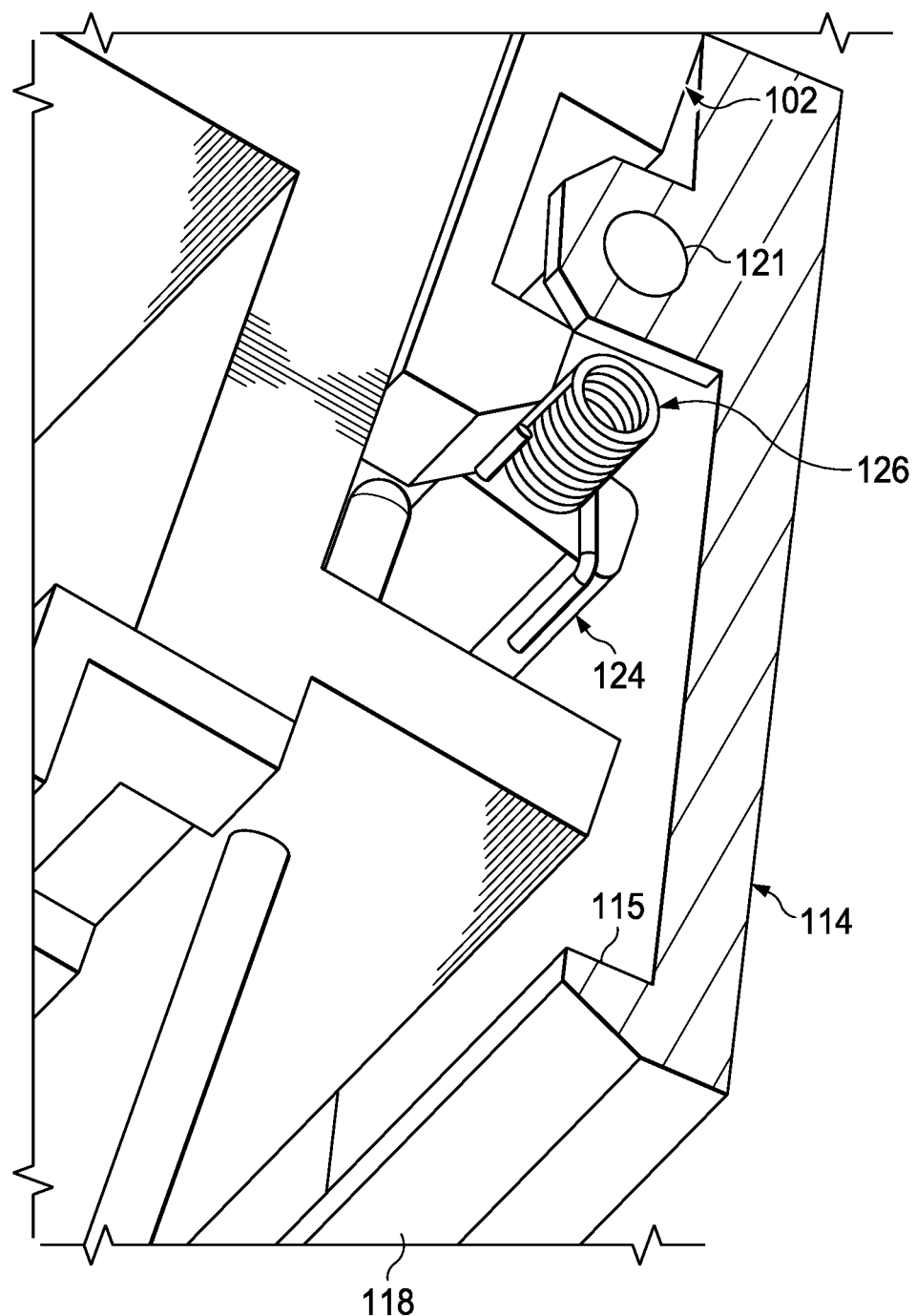
FIG. 4 is a partial back perspective view of a portion of an example clamp interlock of FIG. 1 with a helical spring that biases a cam to rotate the clip toward the first or open position.

Referring also to FIGS. 3 and 4, a suitable types and configurations of the first and second springs can be used in different implementations. FIG. 3 shows a portion of another example clamp interlock clip 114 and cam 124. In this example, the second spring 131 is a compression spring with a first end connected between the base 102 and a second end connected to the first clip 114 to bias the clip 114 toward the second clip position of FIG. 2. FIG. 4 shows a back side perspective view of a portion of an implementation of the clamp interlock of FIGS. 1-3 in which the first spring 126 is a helical spring that biases the first cam 124 to rotate the first clip 114 toward the first or open position of FIG. 1. The helical spring 126 in this example has a first end that engages the base 102, and a second end that engages the first cam 124 to bias the cam 124 toward the first cam position of FIG. 1.

The example clips 114 and 116 facilitate clamping or attachment of laterally opposite sides or features of a device carrier structure to allow the chuck apparatus 100 to effectively pick up and move the carrier and installed DUT from a first location to a second location, such as a test station. The clamping or engagement of the chuck apparatus 100 can include further clips (not shown), for example, to engage with a front and back feature of such a carrier structure. In addition, multiple clip systems can be provided on a given lateral side in different implementations (not shown).

In the illustrated example, the clips 114 and 116 are mounted to the base 102, and are pivotal about the respective first pivot axes 121 and 122 between the respective first and second clip positions as seen in FIGS. 1 and 2. The abutment surfaces 115 and 117 are each spaced apart from the respective pivot axis 121 and 122. In the illustrated example, moreover, the second springs 131 and 132 provide a bias force against an upper portion of the respective clips 114 and 116. The bias springs 131 and 132 and the abutment surfaces 115 and 117 are on opposite ends relative to the respective pivot axes 121 and 122 in the illustrated example. In other implementations, the engagement location of the second bias springs 131 and 132 with the respective clips 114 and 116 can be at different locations along the length of the clips 114 and 116, such as between the respective pivot axes 121 and 122 and the respective abutment surfaces 115 and 117. The location and positioning of the cams and the associated first springs 126 and 129 can be any suitable configuration to provide the described biasing of the respective cams 124 and 127.

Referring also to FIGS. 5-10, FIG. 5 shows an example method 500 for operating a chuck apparatus for automated device testing, including operation of the chuck apparatus 100 of FIGS. 1-4 during pick and place automated testing of an electronic device. FIGS. 6-10 illustrate the example chuck apparatus 100 in operation with an installed stop plate 110 to approach and pick up a carrier structure with an installed electronic device to be tested (e.g., referred to herein as a device under test or DUT), and to translate the carrier and DUT to an electronic contactor for automatic testing.

The method 500 begins at 501 with the clips in the first clip positions, in which the clips are spring biased outward by the cams with first springs when no stop plate is installed. FIG. 1 shows this condition, where the stop plate 110 is not yet installed in the chuck apparatus 100. In this condition, the clips 114 and 116 are rotated outward by the respective cams 124 and 127 according to the bias provided by the first springs 126 and 129. As shown in FIG. 1, the biasing force applied to the cams 124 and 127 by the first springs 126 and 129 is greater than the countervailing force applied to the upper ends of the clips 114 and 116 by the respective second springs 131 and 132. Without more, therefore, the clips 114 and 116 will not close to engage any carrier structure until the pins 111 and 112 of the stop plate 110 engage and actuate the respective cams 124 and 127 by translation into the respective openings 106 and 108.

Figure 5:
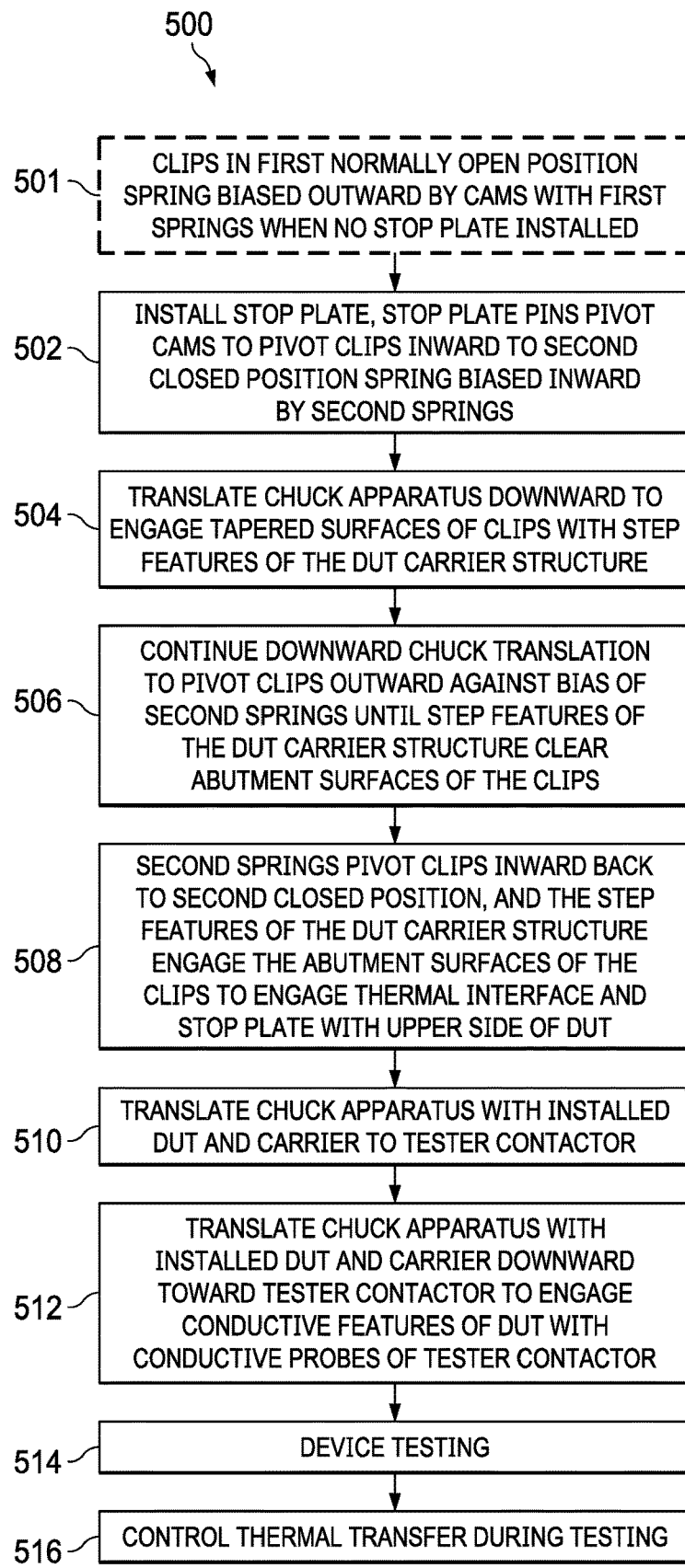
FIG. 5 is a flow diagram of an example method for operating a chuck apparatus for automated device testing.

The method 500 continues at 502 in FIG. 5 with installation of the stop plate. FIG. 2 shows one example in which the stop plate 110 is translated upward to translate the stop plate pins 111 and 112 within the openings 106 and 1082 pivot the respective cams 124 and 127. The rotation of the cams 124 and 127, in turn, pivots the clips 114 and 116 inward to the second (e.g., closed) clip positions. Installing the stop plate 110 in the chuck apparatus 100 at 502 in this example includes translating the stop plate pins 111, 112 into the respective base openings 106, 108 to rotate the cams 124, 127 from the first cam position to a second cam position to allow the springs 131, 132 to rotate the respective clips 114, 116 from the first clip position to the second clip position. FIG. 2 shows dashed line arrows indicating the relative movements of the cams 124, 127, the clips 114, 116, and the stop plate 110 relative to the positions shown in FIG. 1.

Figure 6:
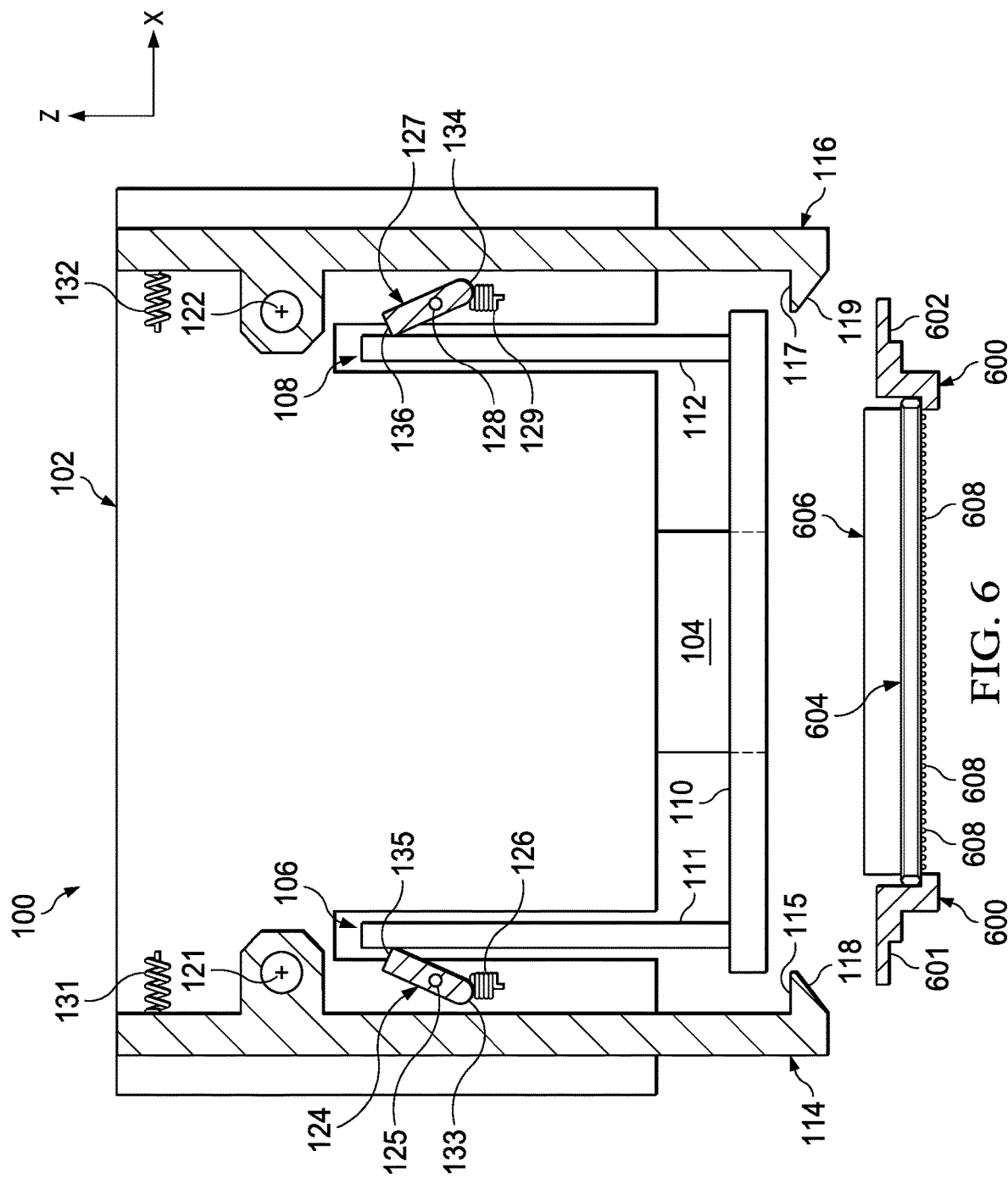
FIG. 6 is a partial sectional side elevation view of the chuck apparatus of FIGS. 1 and 2 positioned over a carrier structure with an installed DUT.
Figure 7:
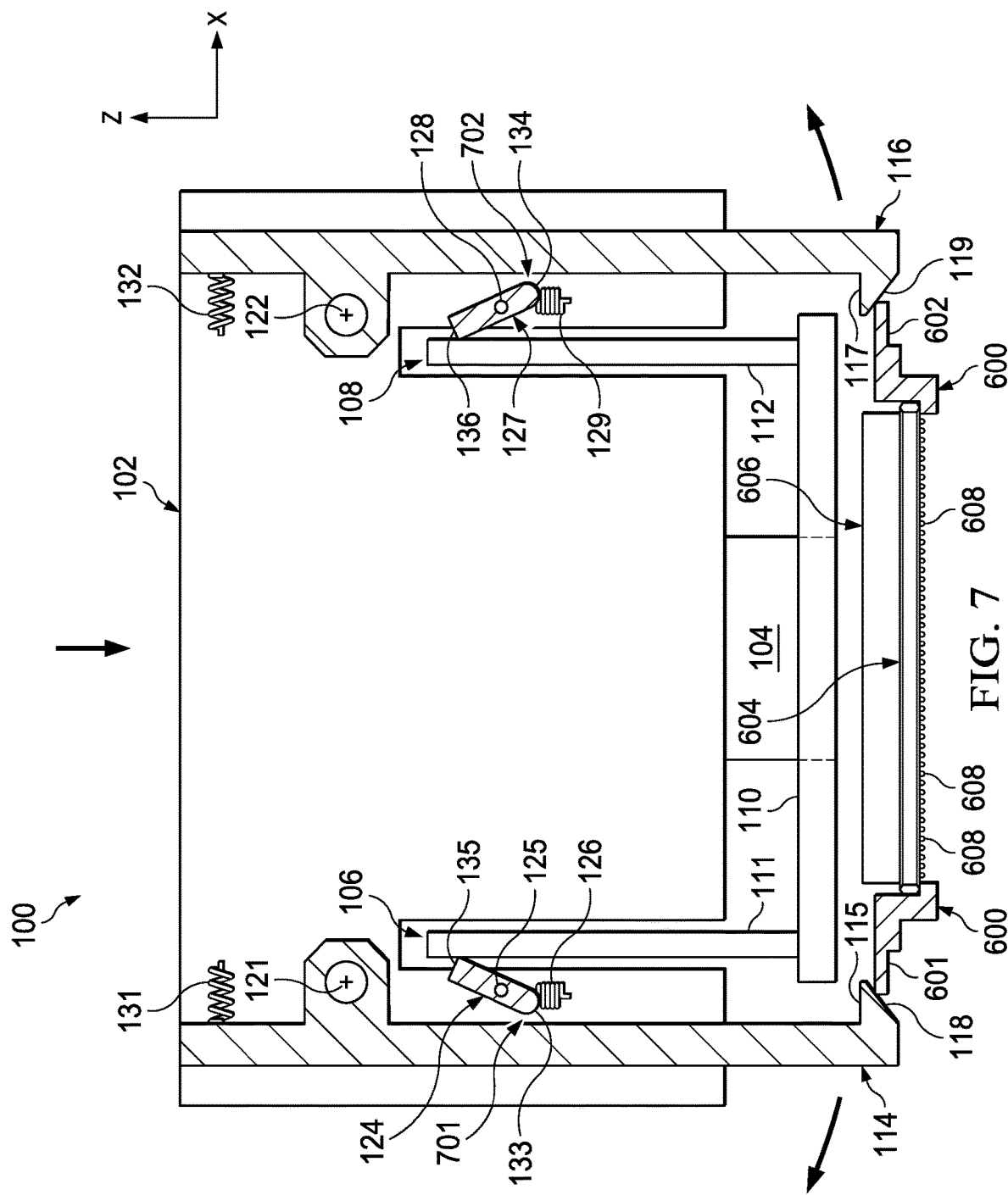
FIG. 7 is a partial sectional side elevation view of the chuck apparatus of FIGS. 1, 2 and 6 translating toward the carrier structure with a portion of the carrier structure engaging tapered surfaces of the clips to pivot the clips outward against a spring bias.
Figure 8:
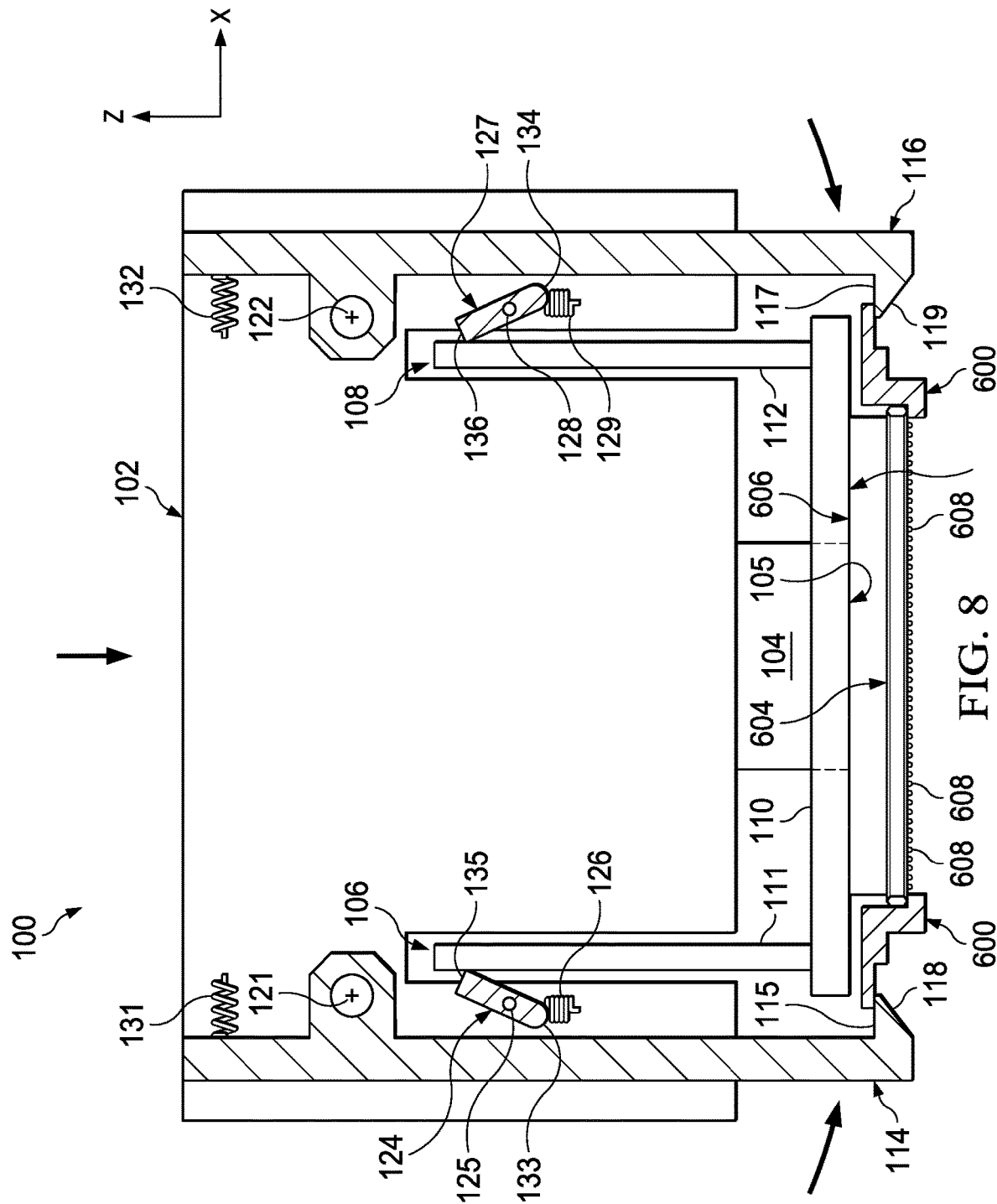
FIG. 8 is a partial sectional side elevation view of the chuck apparatus of FIGS. 1, 2, 6 and 7 further translated after the carrier structure clears abutment surfaces of the clips with the clips pivoted back to the second or closed position to engage step features of the carrier structure with the abutment surfaces of the clips.

At 504 in FIG. 5, the method 500 also includes translating the chuck apparatus downward to engage tapered surfaces of the clips with step features of a carrier structure. FIGS. 6-8 show one example, in which the chuck apparatus 100 is translated downward in a first direction (e.g., the negative Z direction in FIG. 6) toward a carrier structure 600. The carrier structure 600 in this example has an installed electronic device, referred to as a device under test or DUT. The electronic device includes a substrate 604 with an attached lid 606 in this example, although the lid 606 can be omitted in other implementations. In one example, the DUT, and the lower side of the substrate 604 in particular, includes solder bumps or other conductive features 608.

At 506 in FIG. 5, the downward translation of the chuck apparatus 100 with the installed stop plate 110 continues. FIG. 7 shows one example in which the continued downward chuck translation engages the tapered clip surfaces 118, 119 with respective step features 601 and 602 of the carrier structure 600. The initial engagement in FIG. 7 begins to pivot the clips 114, 116 from the respective second clip positions outward toward the first clip positions. In this position, the outward pivoting of the clips 114 and 116 works against the bias force of the respective second springs 131 and 132. At the same time, the engagement of the stop plate pins 111 and 112 with the second surfaces of the respective cams 124 and 127 continues to counteract the biasing force of the first springs 126 and 129 on the respective cams 124 and 127. Accordingly, the cams 124 and 127 remain stationary while the engagement of the tapered surfaces 118 and 119 of the respective clips 114 and 116 pivots the clips outward, which creates gaps 701 and 702 between the first cam surfaces 133 and 134 and the respective clips 114 and 116 as shown in FIG. 7. The translation at 506 in FIG. 5 continues until the carrier structure step features 601, 602 clear the abutment surfaces 115, 117 of the respective clips 114, 116.

At 508 in FIG. 5, the passage of the step features of the carrier structure 600 past the abutment surfaces 115 and 117 causes the second springs 131 and 132 to pivot the respective clips 114 and 116 back to the second clip positions. FIG. 8 shows one example, in which the chuck apparatus 100 is further translated after the carrier structure clears abutment surfaces 115 and 117 of the respective clips 114 and 116. This final translation engages the step features 601 and 602 of the carrier structure 600 with the respective abutment surfaces 115 and 117. The engagement also engages the thermal interface 104 and the stop plate 110 with the DUT installed in the carrier structure 600. In the illustrated example, the DUT includes the substrate 604 and the lid 606, and the thermal interface 104 engages with the lid 606. In another implementation for a DUT without the lid 606, the thermal interface 104 engages with the top side of the substrate 604.

The processing at 504-508 implements a picking operation, in which the chuck apparatus 100 picks up the carrier structure 600 with the installed DUT. The method 500 in FIG. 5 further includes movement of the chuck apparatus 100 with the engaged DUT and carrier structure 600, to a test location for automated testing of the DUT.

Figure 9:
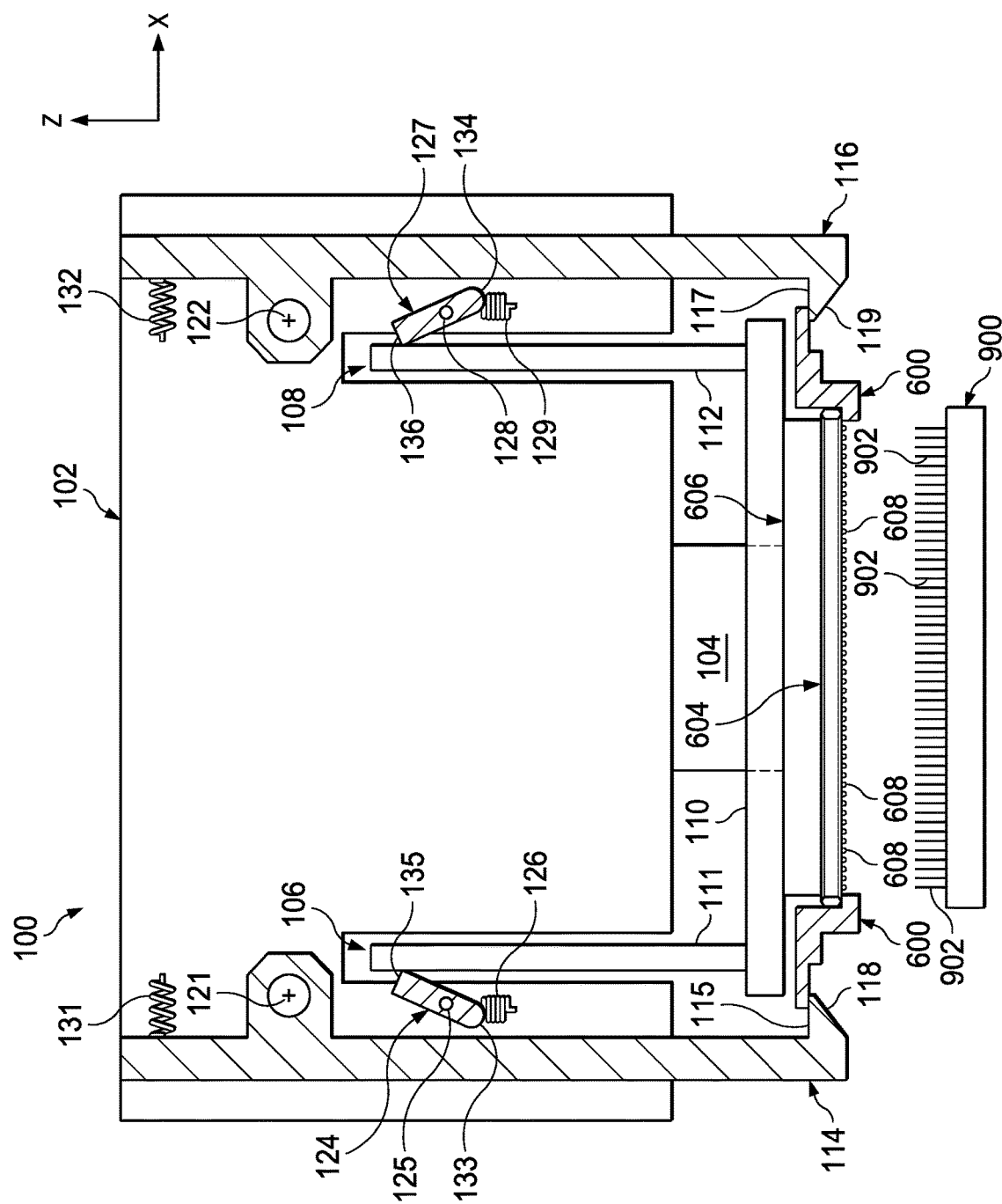
FIG. 9 is a partial sectional side elevation view of the chuck apparatus of FIGS. 1, 2 and 6-8 with the engaged carrier structure and installed DUT translated over a test contactor.

Referring also to FIG. 9, the method 500 continues at 510 in FIG. 5 with translating the chuck apparatus 100 with the installed DUT and carrier structure 600 toward a tester contactor. FIG. 9 shows one example in which the chuck apparatus 100 is translated along with the engaged carrier structure 600 and DUT to a tester contactor 900. The contactor 900 in FIG. 9 is a test bed for electrical probe and automated testing of an electronic device. The example contactor 900 includes conductive probes 902 arranged in an array on a top side of the contactor 900 in locations that correspond to conductive features 608 on the bottom side of the DUT. For example, the conductive probes 902 can be spring-loaded pins, and the conductive features 608 can be conductive copper pillars, solder bumps, pads, or other conductive structures on the bottom side of the electronic device DUT.

Figure 10:
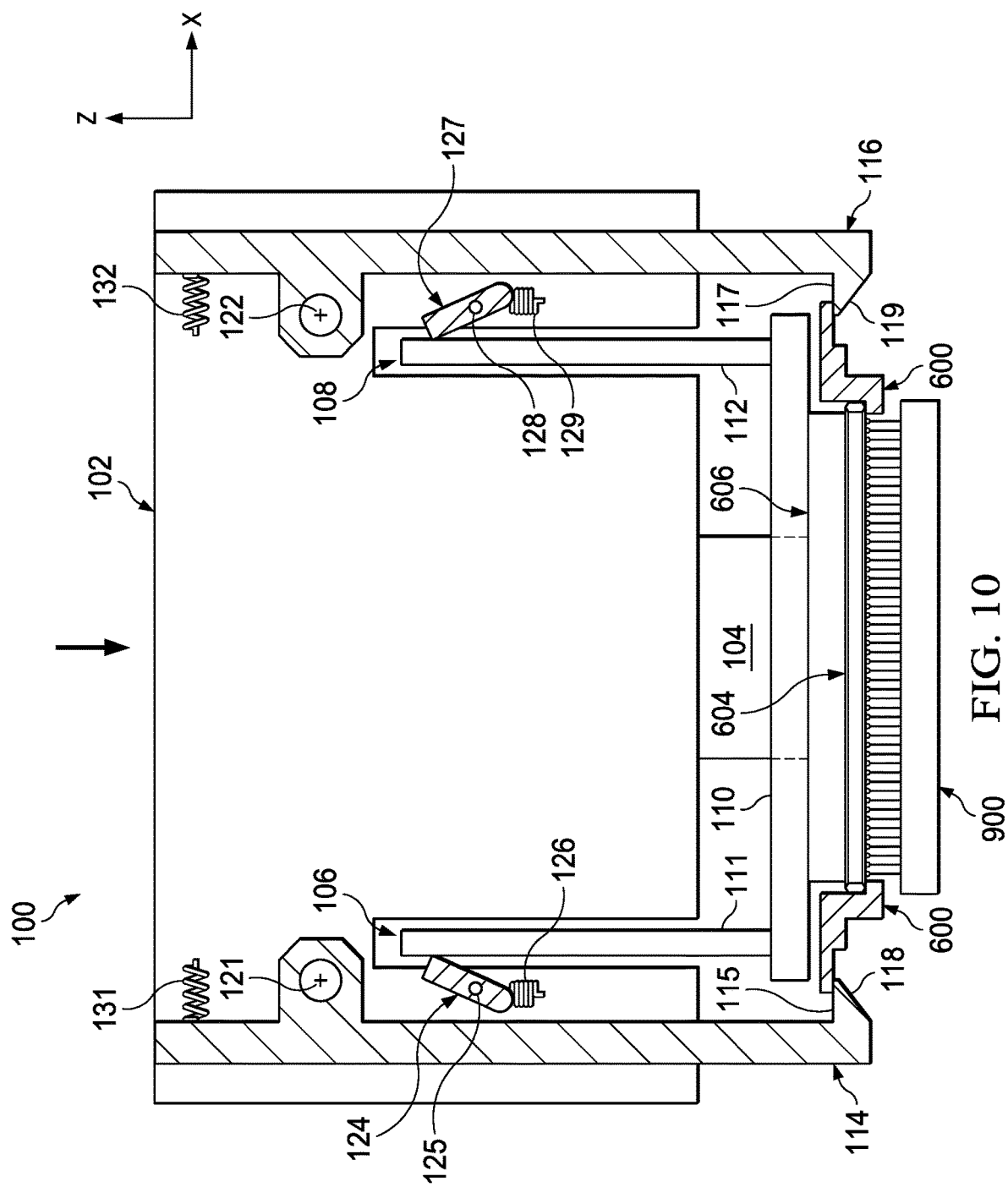
FIG. 10 is a partial sectional side elevation view of the chuck apparatus of FIGS. 1, 2 and downward to engage conductive features of the DUT with conductive probes of the contactor.

The method 500 continues at 512 in FIG. 5, with translation of the chuck apparatus 100 with the installed DUT and carrier downward toward the tester contactor. FIG. 10 shows one example, in which the chuck apparatus 100 is further translated downward to engage the conductive features 608 of the DUT with the conductive probes 902 of the contactor 900. The method 500 further includes testing the DUT at 514, and controlling thermal transfer at 516 between the thermal interface 104 and the installed DUT during testing. Once the thermally managed testing is completed at 516, the chuck apparatus 100 is translated upward and away from the tester contactor 900, and the tested DUT and the carrier 600 are returned to a tray structure (not shown).

Figure 11:
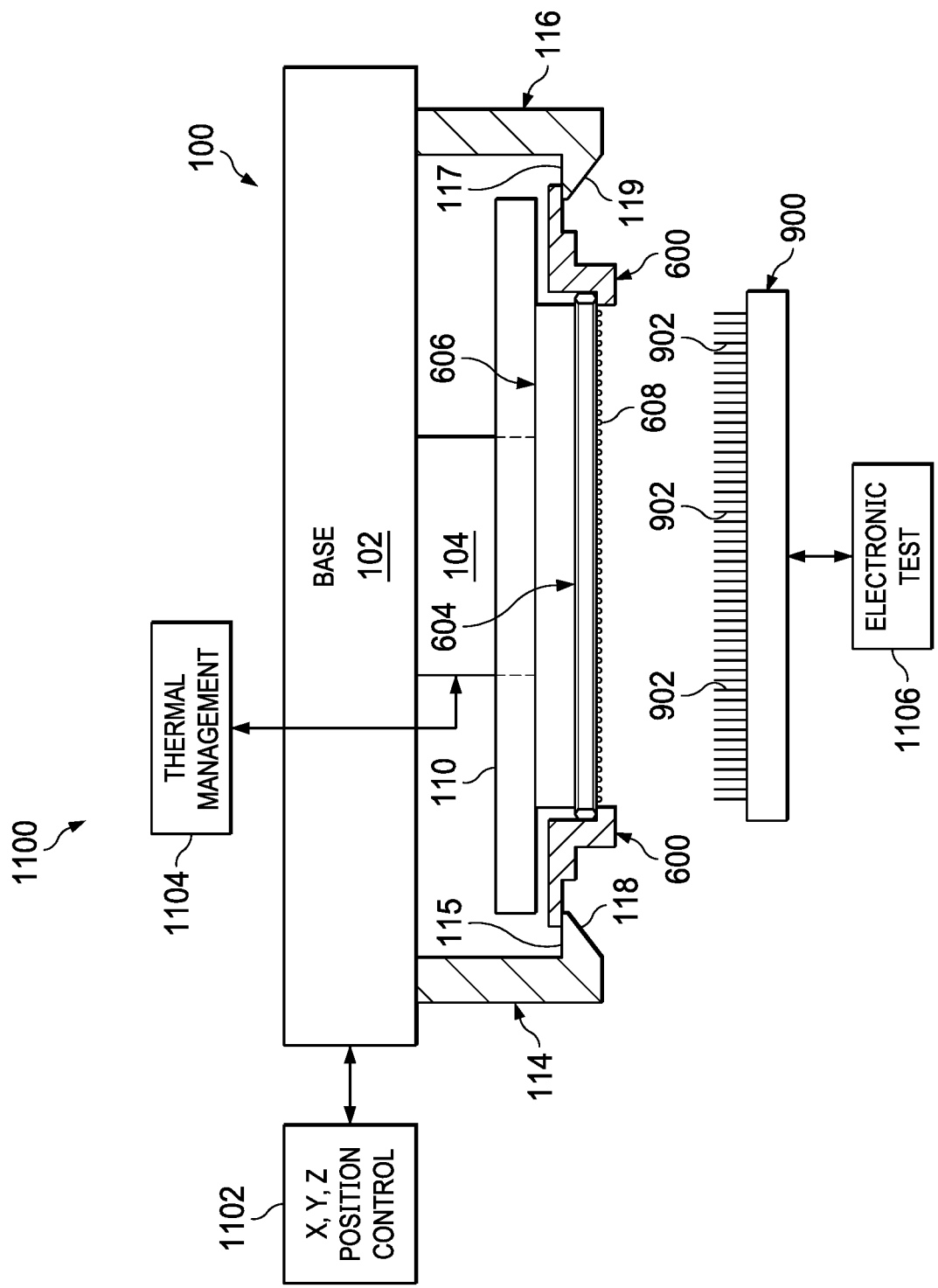
FIG. 11 is a simplified partial schematic view of an example automated pick and place electronic device test system with thermal management to perform electronic testing while controlling thermal transfer between the thermal interface of the chuck apparatus and the DUT.

FIG. 11 shows a test system 1100 system. In one example, the system 1100 is a thermal control pick and place handler, such as a Summit SHP handler available from Delta Design-USA of Poway Calif., modified with the chuck apparatus 100 described above. The system 1100 in one example is used for automated semiconductor device testing with thermal management, such as for burn in testing during manufacturing of packaged electronic devices. The system 1100 includes a chuck apparatus 100 with a base 102, and clips 114 and 116 mounted to the base 102 as described above. The system 1100 further includes a position control system 1102 operatively connected by suitable linear position control actuators (not shown) to control the position of the base 102. In addition, the system 1100 includes a thermal management system connected to the thermal interface 104 of the chuck apparatus 100. The system 1100 also includes a contactor 900 with conductive probes 902 to connect to the DUT, and an electronic test circuit 1106 connected to the contactor 900 to test the DUT.

The position control system 1102 is configured to automatically control a position of the chuck apparatus 100. For example, the position control system 1102 is programmed to implement translation of the chuck in three dimensions X, Y, and Z for pick and place operations to automatically pick up a carrier structure 600 loaded with a DUT, to translate the carrier structure 600 and the installed DUT to the tester contactor 900. In one example, the system 100 supports high power circuit device testing applications that require heat dissipation under test. The thermal interface 104 includes the bottom side that contacts the installed DUT when the abutment surface 115, 117 of the clip 114, 116 engages the step features 601, 602 of the carrier structure 600, and the thermal management system 1104 is configured to control thermal transfer between the thermal interface 104 and the installed DUT during testing. In one example, the thermal management system 1104 is configured to control the DUT thermal response while minimizing junction temperature (e.g., Tj) rise of electronic components in the DUT. The system 1100 is configured to test the DUT using the electronic test circuit 1106 connected to the contactor 900, and to control thermal transfer between the thermal interface 104 and the installed DUT using the thermal management system 1104 connected to the thermal interface 104.

Modifications are possible in the described embodiments, and other embodiments are possible, within the scope of the claims.

The following is claimed:

1. A chuck apparatus, comprising:
a clip mounted to a base and pivotal about a first pivot axis between a first clip position and a second clip position, the clip including an abutment surface spaced apart from the first pivot axis and spaced apart from a path of a carrier structure when the clip is in the first clip position, the abutment surface is positioned to engage the carrier structure to secure the carrier structure and an installed device under test (DUT) to the chuck apparatus when the clip is in the second clip position;
a cam mounted to the base and pivotal about a second pivot axis between a first cam position and a second cam position, the cam including a first surface that engages the clip to pivot the clip to the first clip position when the cam is in the first cam position, and a second surface that extends into an opening of the base when the cam is in the first cam position;
a first spring connected between the base and the cam to bias the cam toward the first cam position; and
a second spring connected between the base and the clip to bias the clip toward the second clip position.

2. The chuck apparatus of claim 1, further comprising:
a stop plate; and
a pin that extends outward from a side of the stop plate to engage the second surface of the cam in the opening of the base to rotate the cam from the first cam position to the second cam position when the stop plate is installed in the chuck apparatus.

3. The chuck apparatus of claim 2, wherein the first spring is a helical spring with a first end engaging the base and a second end engaging the cam to bias the cam toward the first cam position.

4. The chuck apparatus of claim 3, wherein the second spring is a compression spring with a first end connected between the base and a second end connected to the clip to bias the clip toward the second clip position.

5. The chuck apparatus of claim 4, wherein the clip includes a tapered surface that engages the carrier structure to pivot the clip from the second clip position toward the first clip position when the chuck apparatus is translated toward the carrier structure.

6. The chuck apparatus of claim 2, wherein the second spring is a compression spring with a first end connected between the base and a second end connected to the clip to bias the clip toward the second clip position.

7. The chuck apparatus of claim 2, wherein the clip includes a tapered surface that engages the carrier structure to pivot the clip from the second clip position toward the first clip position when the chuck apparatus is translated toward the carrier structure.

8. The chuck apparatus of claim 1, wherein the first spring is a helical spring with a first end engaging the base and a second end engaging the cam to bias the cam toward the first cam position.

9. The chuck apparatus of claim 1, wherein the second spring is a compression spring with a first end connected between the base and a second end connected to the clip to bias the clip toward the second clip position.

10. The chuck apparatus of claim 1, wherein the clip includes a tapered surface that engages the carrier structure to pivot the clip from the second clip position toward the first clip position when the chuck apparatus is translated toward the carrier structure.

11. The chuck apparatus of claim 1, further comprising a thermal interface mounted to the base and including a side that contacts the installed DUT when the abutment surface of the clip engages the carrier structure.

12. A system, comprising:
a chuck apparatus, including a base, and a clip mounted to the base;
a position control system configured to control a position of the chuck apparatus;
a contactor with conductive probes to connect to an electronic device under test (DUT); and
an electronic test circuit connected to the contactor to test the DUT;
the clip being pivotal about a first pivot axis between a first clip position and a second clip position, the clip including an abutment surface spaced apart from the first pivot axis and spaced apart from a path of a carrier structure when the clip is in the first clip position, the abutment surface is positioned to engage the carrier structure to secure the carrier structure and an installed device under test (DUT) to the chuck apparatus when the clip is in the second clip position;

the chuck apparatus including:
a cam mounted to the base and pivotal about a second pivot axis between a first cam position and a second cam position, the cam including a first surface that engages the clip to pivot the clip to the first clip position when the cam is in the first cam position, and a second surface that extends into an opening of the base when the cam is in the first cam position,
a first spring connected between the base and the cam to bias the cam toward the first cam position, and
a second spring connected between the base and the clip to bias the clip toward the second clip position.

13. The system of claim 12,
wherein the chuck apparatus includes a thermal interface mounted to the base and including a side that contacts the installed DUT when the abutment surface of the clip engages the carrier structure; and
a thermal management system connected to the thermal interface to control thermal transfer between the thermal interface and the installed DUT.

14. The system of claim 13, further comprising:
a stop plate; and
a pin that extends outward from a side of the stop plate to engage the second surface of the cam in the opening of the base to rotate the cam from the first cam position to the second cam position when the stop plate is installed in the chuck apparatus.

15. The system of claim 12, further comprising:
a stop plate; and
a pin that extends outward from a side of the stop plate to engage the second surface of the cam in the opening of the base to rotate the cam from the first cam position to the second cam position when the stop plate is installed in the chuck apparatus.

16. The system of claim 12, wherein the clip includes a tapered surface that engages the carrier structure to pivot the clip from the second clip position toward the first clip position when the chuck apparatus is translated toward the carrier structure.

17. The system of claim 12, wherein the first spring is a helical spring with a first end engaging the base and a second end engaging the cam to bias the cam toward the first cam position.

18. The system of claim 12, wherein the second spring is a compression spring with a first end connected between the base and a second end connected to the clip to bias the clip toward the second clip position.

19. A method, comprising:
installing a stop plate in a chuck apparatus, including translating a pin of the stop plate into an opening of a base of the chuck apparatus to rotate a cam from a first cam position to a second cam position to allow a spring to rotate a clip from a first clip position to a second clip position;
translating the chuck apparatus in a first direction toward a carrier structure to engage a tapered surface of the clip with the carrier structure to pivot the clip from the second clip position toward the first clip position;
continuing translation of the chuck apparatus in the first direction to pivot the clip outward against a bias of the spring until the carrier structure clears an abutment surface of the clip; and
pivoting the clip back to the second clip position using the spring after the carrier structure clears the abutment surface of the carrier structure to engage a step feature of the clip with the abutment surface to engage a thermal interface and the stop plate with a device under test (DUT) installed in the carrier structure.

20. The method of claim 19, further comprising:
translating the chuck apparatus with the installed DUT and carrier structure toward a contactor to engage conductive features of the DUT with conductive probes of the contactor;
testing the DUT using an electronic test circuit connected to the contactor; and
controlling thermal transfer between the thermal interface and the installed DUT using a thermal management system connected to the thermal interface.

* * * * *